(12) United States Patent
Haba et al.

(10) Patent No.: US 8,569,884 B2
(45) Date of Patent: Oct. 29, 2013

(54) MULTIPLE DIE IN A FACE DOWN PACKAGE

(75) Inventors: Belgacem Haba, Saratoga, CA (US);
Wael Zohni, San Jose, CA (US);
Richard Dewitt Crisp, Hornitos, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/209,596

(22) Filed: Aug. 15, 2011

(65) Prior Publication Data

US 2013/0043582 A1 Feb. 21, 2013

(51) Int. Cl.
*H01L 23/482* (2006.01)

(52) U.S. Cl.
USPC .......... 257/735; 257/E23.079; 257/686; 257/777; 257/685; 257/723; 257/724; 257/728; 257/784; 257/786; 257/773; 257/774; 257/737; 257/738

(58) Field of Classification Search
USPC .......... 257/735, 777, E23.079, 686, 685, 723, 257/724, 728, 784, 786, 773, 774, 737, 738
See application file for complete search history.

(56) References Cited

U.S. PATENT DOCUMENTS

| 7,638,868 | B2 * | 12/2009 | Haba | 257/686 |
| 8,026,611 | B2 * | 9/2011 | Mohammed et al. | 257/776 |
| 8,299,626 | B2 * | 10/2012 | Mohammed et al. | 257/777 |
| 8,304,881 | B1 * | 11/2012 | Haba et al. | 257/686 |
| 2008/0042249 | A1 * | 2/2008 | Haba | 257/686 |
| 2008/0237832 | A1 * | 10/2008 | Hsu et al. | 257/691 |
| 2008/0251938 | A1 * | 10/2008 | Wang et al. | 257/777 |
| 2009/0051024 | A1 * | 2/2009 | Chia | 257/686 |
| 2012/0013028 | A1 * | 1/2012 | Mohammed et al. | 257/777 |
| 2012/0267796 | A1 * | 10/2012 | Haba et al. | 257/777 |
| 2012/0267798 | A1 * | 10/2012 | Haba et al. | 257/777 |
| 2012/0273826 | A1 * | 11/2012 | Yamamoto et al. | 257/99 |

* cited by examiner

*Primary Examiner* — A O Williams
(74) *Attorney, Agent, or Firm* — Lerner, David, Littenberg, Krumholz & Mentlik, LLP

(57) ABSTRACT

A microelectronic package includes a subassembly including a first substrate and first and second microelectronic elements having contact-bearing faces facing towards oppositely-facing first and second surfaces of the first substrate and each having contacts electrically connected with the first substrate. The contact-bearing faces of the first and second microelectronic elements at least partially overlie one another. Leads electrically connect the subassembly with a second substrate, at least portions of the leads being aligned with an aperture in the second substrate. The leads can include wire bonds extending through an aperture in the first substrate and joined to contacts of the first microelectronic element aligned with the first substrate aperture. In one example, the subassembly can be electrically connected with the second substrate using electrically conductive spacer elements.

37 Claims, 10 Drawing Sheets

MULTIPLE DIE IN A FACE DOWN PACKAGE

BACKGROUND OF THE INVENTION

The present invention relates to microelectronic packages or assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of a package substrate, i.e., chip carrier and the contacts on the chip are bonded directly to contacts of the chip carrier by a conductive material such as a joining metal which can include solder bumps or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the entire disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Microelectronic elements such as bare semiconductor chips can be mounted in individual chip packages or combined with other semiconductor chips in a multiple-chip package or assembly. Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite advances that have been made in the fabrication of multiple-chip packages and assemblies, further improvements can be made.

SUMMARY OF THE INVENTION

In accordance with an aspect of the invention, a microelectronic package includes a subassembly including a first substrate and first and second microelectronic elements having contact-bearing faces facing towards oppositely-facing first and second surfaces of the first substrate and each having contacts electrically connected with the first substrate. The contact-bearing faces of the first and second microelectronic elements at least partially overlie one another. Leads can electrically connect the subassembly with a second substrate, at least portions of the leads being aligned with an aperture in the second substrate. The leads can include wire bonds extending through an aperture in the first substrate and joined to contacts of the first microelectronic element aligned with the first substrate aperture.

In one example, the leads can be wire bonds extending through the aperture. In a particular example, at least some of the wire bonds can extend from substrate contacts on one of the first or second surfaces of the first substrate.

In another example, the leads can include beam leads extending along a surface of the second substrate and beyond an edge of the second substrate.

In such embodiment, alternatively or in addition to other electrical connections that can exist between the subassembly and the second substrate, wire bonds can extend about an edge of the first substrate and bonded to contacts at the first surface of the second substrate.

In accordance with another aspect of the invention, a microelectronic package is provided which includes a subassembly including a first substrate and first and second microelectronic elements having contact-bearing faces facing towards oppositely-facing first and second surfaces of the first substrate and each having contacts electrically connected with the first substrate. The contact-bearing faces of the first and second microelectronic elements at least partially overlie one another.

First and second electrically conductive spacer elements each extending between one of the first or second surfaces of the first substrate and the first surface of the second substrate can electrically interconnect the first and second substrates. The first and second spacer elements can be configured to simultaneously carry first and second different signals.

In a particular example, each electrically conductive spacer element can be joined to a first contact of the first substrate and to a second contact of the second substrate. In one example, each electrically conductive spacer element includes an electrically conductive mass such as a mass of bond material, e.g., a bond metal such as solder, tin, indium, gold, or conductive paste or a conductive matrix material such as described in commonly owned U.S. application Ser. No. 13/158,797, the disclosure of which is incorporated herein by reference.

In a particular embodiment, each electrically conductive spacer element can include a solid metal post having an end surface projecting to a height above a surface of the first or second substrates, and an edge surface extending at an angle away from the end surface.

The above-discussed microelectronic assemblies can further include an encapsulant contacting the first and second microelectronic elements. The encapsulant can be an overmold contacting at least edges of the first and second microelectronic elements. In a particular example, the encapsulant may fully cover the first and second microelectronic elements.

In a particular embodiment, the microelectronic assembly can include both electrically conductive spacer elements as described above and leads having portions aligned with an aperture in the second substrate. In one example, the leads can be wire bonds and the leads can extend through an aperture in the first substrate and be joined to element contacts of the first microelectronic element.

In a particular embodiment, the microelectronic assembly may include second leads having portions aligned with the aperture, the second leads electrically connecting the element contacts of the first microelectronic element with the first substrate. In particular examples, the second leads may include or may be wire bonds.

In another example, the microelectronic assembly may include second leads which have portions extending beyond an edge of the first substrate, the portions joined with first contacts exposed at a surface of at least one of the first or second microelectronic elements. In one example, the edge is an edge of an aperture extending between the first and second surfaces of the first substrate, the second leads having portions aligned with the aperture, the portions being joined with the first contacts.

In a particular example, third leads can electrically connecting at least some of the second contacts of the second microelectronic element with the first substrate. The third leads can have portions extending beyond an edge of the first substrate, the portions joined with the second contacts. In such example, the edge can be an edge of an aperture extending between the first and second surfaces of the substrate, the third leads having portions aligned with the aperture, and the portions being joined with the second contacts.

In one example, the second contacts of the second microelectronic element can be disposed beyond an edge of the first microelectronic element, and the third leads can extend from the second contacts through the aperture. In such example, the third leads may include wirebonds.

In the microelectronic assemblies according to the above-discussed aspects of the invention, a third microelectronic element may have a front surface facing the first substrate and overlying at least a portion of the front surface of the first microelectronic element, the third microelectronic element having a plurality of third contacts at the front surface thereof electrically connected with the first substrate. Such microelectronic assembly may further include fourth leads electrically connecting at least some of the third contacts of the third microelectronic element with the first substrate.

The fourth leads may have portions extending beyond an edge of the first substrate, the portions being joined with the third contacts. In a particular example, the edge of the first substrate may be an edge of an aperture extending between the first and second surfaces of the substrate. The fourth leads having portions aligned with the aperture, the portions being joined with the third contacts.

In a particular embodiment, third contacts of the third microelectronic element may be disposed beyond an edge of the first microelectronic element, and the fourth leads may extend from the third contacts through the aperture. The fourth leads may include or be wirebonds.

In a particular example, the second and third microelectronic elements can be disposed between the first and second substrates. Alternatively, the first microelectronic element can be disposed between the first and second substrates.

In accordance with a particular aspect of the invention, the first contacts of the first microelectronic element can face first substrate contacts exposed at the first surface of the substrate. The microelectronic assembly may further include conductive masses, e.g., of a bond metal such as solder, tin, indium, or other bond material, electrically connecting the first contacts with the first substrate contacts.

In accordance with a particular aspect of the invention, the second contacts of the second microelectronic element face second substrate contacts exposed at the second surface of the substrate, and the microelectronic assembly can further include conductive masses electrically connecting the second contacts with the second substrate contacts.

In accordance with another aspect of the invention, a microelectronic assembly such as a microelectronic package is provided which includes a subassembly including first and second microelectronic elements having contact-bearing faces facing one another. Each of the first and second microelectronic elements has an electrically conductive redistribution layer at a front surface thereof contacting at least some of the chip contacts of the second chip and extending along the surface thereof from the chip contacts of the second semiconductor chip. In this embodiment, the redistribution layer of the second microelectronic element has contacts or redistribution contacts which face the contacts or redistribution contacts of the redistribution layer of the first microelectronic element and are joined thereto.

The joints between the first and second microelectronic elements can be by direct interconnections between pads of the microelectronic elements using relatively thin layers of a joining metal such as solder, tin, indium, or copper or a combination of two or more of such joining metals. Alternatively, the joints can be formed by metal-to-metal joining, e.g., copper to copper joining, between contacts or redistribution contacts of each of the first and second microelectronic elements. In another example, oxide-joining can be further used to enhance the mechanical connection between the first and second microelectronic elements.

In a particular embodiment, the first and second microelectronic elements may be electrically connected to one another with electrically conductive bumps between surfaces of the redistribution layers of respective microelectronic elements which face one another. The subassembly is electrically connected with a substrate having terminals thereon for electrical interconnection with an external component. For example, leads may electrically interconnect the subassembly with the substrate, or electrically conductive spacer elements can provide the electrical interconnections between the first and second substrates as discussed above.

In particular examples, the leads can have portions aligned with an opening in the substrate. In one example, the leads can extend about an edge of at least one of the first or second microelectronic elements. In a particular example, the leads can include wire bonds which extend through an opening in the substrate. The leads may include wire bonds which extend about an edge of the second microelectronic element and are bonded to contacts at the first surface of the substrate.

In one example, the leads can have portions aligned with an opening in the substrate. The leads may include wire bonds which extend from one of the first or second microelectronic elements through an opening in the substrate. The wire bonds may extend from contacts of the first microelectronic element disposed beyond an edge of the second microelectronic element. Alternatively, or in addition thereto, the leads may include wire bonds extending from contacts at the front surface of the second microelectronic element about an edge of the second microelectronic element, the wire bonds joined to contacts at the first surface of the substrate.

A particular aspect of the invention provides a system including a microelectronic assembly or package according to one of the above-described embodiments and one or more other electronic components electrically connected to the microelectronic assembly. The system may further include a housing, wherein the microelectronic assembly and the other electronic components are mounted to the housing.

DETAILED DESCRIPTION

Accordingly, embodiments of the invention provide ways of packaging multiple dies, i.e., microelectronic elements, in a face-down orientation within a microelectronic package. In some embodiments, interconnections between microelectronic elements within the package can be made through a first substrate to which multiple microelectronic elements are mounted on opposite surfaces in a subassembly within the package. In turn, such subassembly is mounted and electrically interconnected with a second substrate having terminals thereon for electrical connection with an external component such as a circuit panel, other microelectronic package or other component, for example. In some embodiments, the subassembly and the second substrate are electrically interconnected by way of leads having portions aligned with an aperture in the second substrate. In some embodiments, the subassembly and the second can be electrically interconnected by way of electrically conductive spacing elements extending between the first and second substrates.

Figure 1:
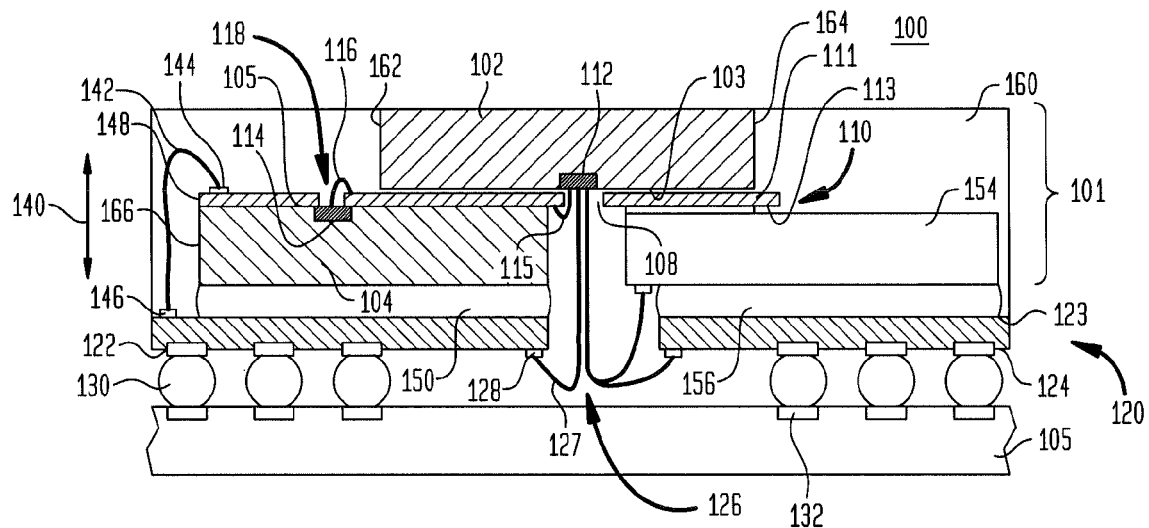
FIG. 1 is a sectional view of a microelectronic package or assembly in accordance with an embodiment of the invention.

Thus, a microelectronic package 100 according to an embodiment of the invention is illustrated in FIG. 1, in which a subassembly 101 includes first and second microelectronic elements 102, 104 mounted in a face-down orientation to opposite surfaces of a first substrate 110. In turn, the subassembly is mounted and electrically interconnected with a second substrate 120 on which a plurality of package terminals 122 are provided for electrically connecting the microelectronic package 100 with an external component, e.g., a circuit panel, other microelectronic package or other component external to the microelectronic package. In the example shown, the terminals 122 can be lands, e.g., electrically conductive pads, exposed at a surface 124 of the second substrate 120 which faces away from the subassembly 101. Joining units 130, e.g., conductive masses of solder, tin, indium, conductive paste, conductive matrix material, etc., can be joined to terminals 122 for use in joining the package 100 with corresponding contacts of an external component such as a circuit panel 105.

In the embodiment shown in FIG. 1, the first microelectronic element 102 has a front face 103 facing a first surface 111 of the first substrate. Microelectronic elements can be semiconductor chips embodying active or passive devices or a combination of active and passive devices. In particular configurations, a microelectronic element can be a semiconductor chip having an electrically conductive redistribution layer thereon having traces or metalized vias formed on the contacts of the semiconductor chip. In one embodiment, such microelectronic element having a redistribution layer can have an encapsulant contacting edges of the semiconductor chip. The encapsulant of the microelectronic element can have a front surface co-planar with a front surface of the semiconductor chip, wherein portions of the redistribution layer, e.g., of the microelectronic element, e.g., contacts and traces overlie the front surface of the encapsulant and are connected to the contacts of the semiconductor chip, such as described above.

The first microelectronic element 102 has a plurality of contacts 112 at the front face 103. The contacts 112 can be electrically interconnected with the first substrate 110 through leads 115, e.g., wire bonds, beam leads, etc., at least portions of which are aligned with an aperture 108 extending between the first and second surfaces 111, 113 of the first substrate 110. The second microelectronic element has a front face 105 facing a second surface 113 of the first substrate. At least a portion of the second microelectronic element 104 may overlie the front surface 103 of the first microelectronic element 102. A plurality of contacts 114 at the front face 105 of the second microelectronic element are electrically connected with the first substrate 110, such as through leads 116 at least portions of which are aligned with a second aperture 118 extending between the first and second surfaces 111, 113 of the first substrate 110.

As further shown in FIG. 1, the second substrate has a first surface 123 facing the subassembly 101 and a second surface 124 opposite thereto on which terminals 122 may be provided. The terminals 122 may be disposed in an area of the second substrate which is aligned with the subassembly 101 in a vertical direction 140 or can be disposed outside an area which is aligned with the subassembly 101, or some terminals can be disposed within an area aligned with the subassembly and some terminals can be disposed outside such area.

Figure 1A:
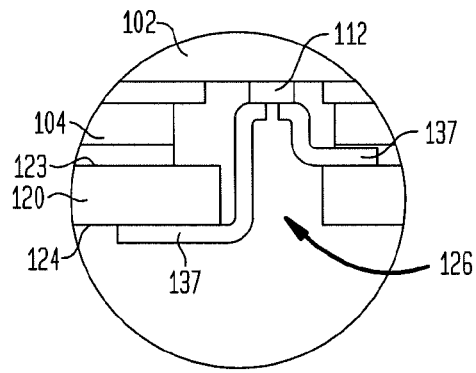

An aperture 126 can extend between the first and second surfaces 123, 124 which can serve as a bond window for forming electrical interconnections between the subassembly 101 and the second substrate. For example, as seen in FIG. 1, the electrical interconnections can include leads 127 having portions aligned with the aperture 126 which electrically connect contacts 112 at the front face 103 of first microelectronic element 102 with corresponding contacts 128 at outwardly-facing surface 124 of the second substrate 120. The leads 127 may be wire bonds extending through the aperture as shown in FIG. 1. Alternatively, as seen in FIG. 1A, some or all of the leads may be beam leads 137 which extend in a direction parallel to a surface 123 or 124 of the second substrate 120 and have portions aligned with aperture 126 and are joined to the contacts 112 of the first microelectronic element 102.

In the embodiment shown in FIG. 1, the subassembly can be bonded to the second substrate using a die attach adhesive 150 or other adhesive, which in a particular case can be made of a compliant material such as silicone or other low modulus of elasticity material. However, in other cases, the adhesive need not have a low modulus of elasticity. In a particular embodiment, a spacer element 154, which can be made of metal, dielectric or semiconductor material, e.g., silicon, can be disposed between the first and second substrates and be affixed with the second substrate 120 using an adhesive 156, such as in a similar manner to the adhesive bonding between the second microelectronic element and second substrate 120. In a particular embodiment, the spacer element 154 could be a capacitor or could embody a plurality of capacitors or other devices, e.g., passive devices such as resistors or inductors. Such device, e.g., a capacitor could be electrically connected to contacts on the first substrate 110, or contacts on the second substrate 120, or to contacts on each of the first and second substrates. In the example illustrated in FIG. 1, a wire bond can electrically connect the passive device, e.g., capacitor, to the first or second microelectronic elements 102, 104, or both the first and second microelectronic elements.

An encapsulant 160 can contact at least edges 162, 164, 166 of the first and second microelectronic elements. The encapsulant can be formed after the subassembly is assembled with the second substrate. For example, the encapsulant can be formed as an overmold, such as by molding a compound covering at least edges of the microelectronic elements and exposed surfaces of the first substrate as well as the first surface 123 of the second substrate.

In a variation of the embodiment shown in FIG. 1, some or all of the terminals can be provided on first surfaces 123 of the second substrate. In yet another variation, some or all terminals can be provided as contacts of a connector configured to form an interference fit with a corresponding external component. For example, terminals can be provided as fingers configured for insertion into a corresponding socket for establishing electrical interconnection between the terminals of the package and corresponding contacts of the socket.

As further shown in FIG. 1, additional leads, e.g., wire bonds 142 can electrically connect contacts 144 exposed at a first surface 111 of the first substrate 110 with corresponding contacts 146 exposed at a first surface 123 of the second substrate. Such wire bonds 142 can extend about an edge 148 of the first substrate.

Figure 2:
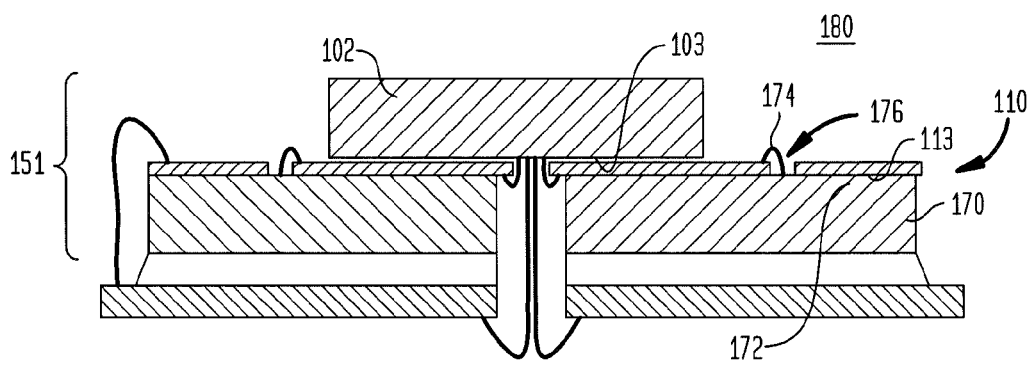
FIG. 2 is a sectional view of a microelectronic package or assembly in accordance with a variation of the embodiment illustrated in FIG. 1.

FIG. 2 illustrates a microelectronic package 180 according to a variation of the embodiment shown in FIG. 1 in which a third microelectronic element 170 has a front face 172 mounted to the second surface 113 of the first substrate 110 and is electrically interconnected therewith. In one embodiment, in subassembly 151, at least a portion of the third microelectronic element 170 may overlie the front surface 103 of the first microelectronic element 102. For example, leads 174 such as wire bonds or beam leads can have portions aligned with a third aperture 176 in the first substrate.

Figure 2A:
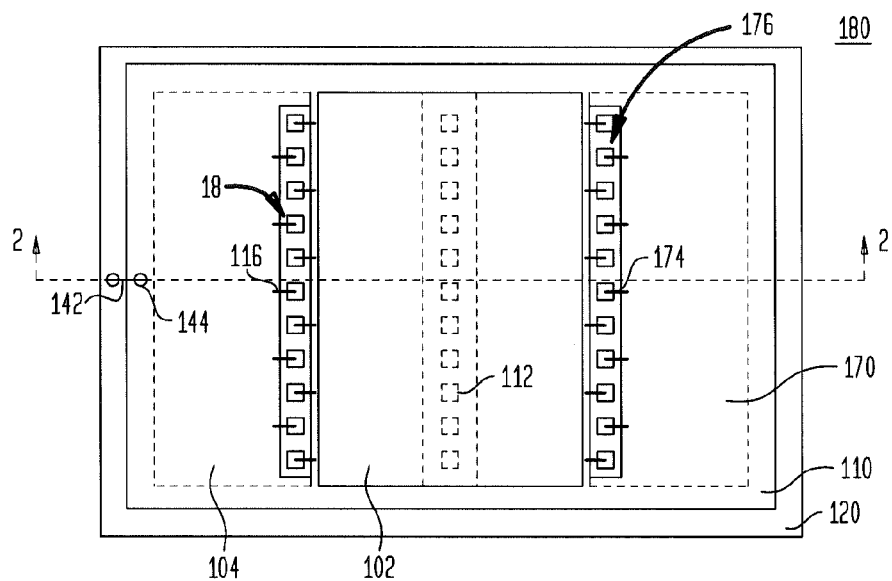
FIG. 2A is a top plan view of a microelectronic package or assembly in accordance with an embodiment of the invention depicted in FIG. 2, wherein the sectional view of FIG. 2 is through line 2-2 of FIG. 2A.
Figure 2B:
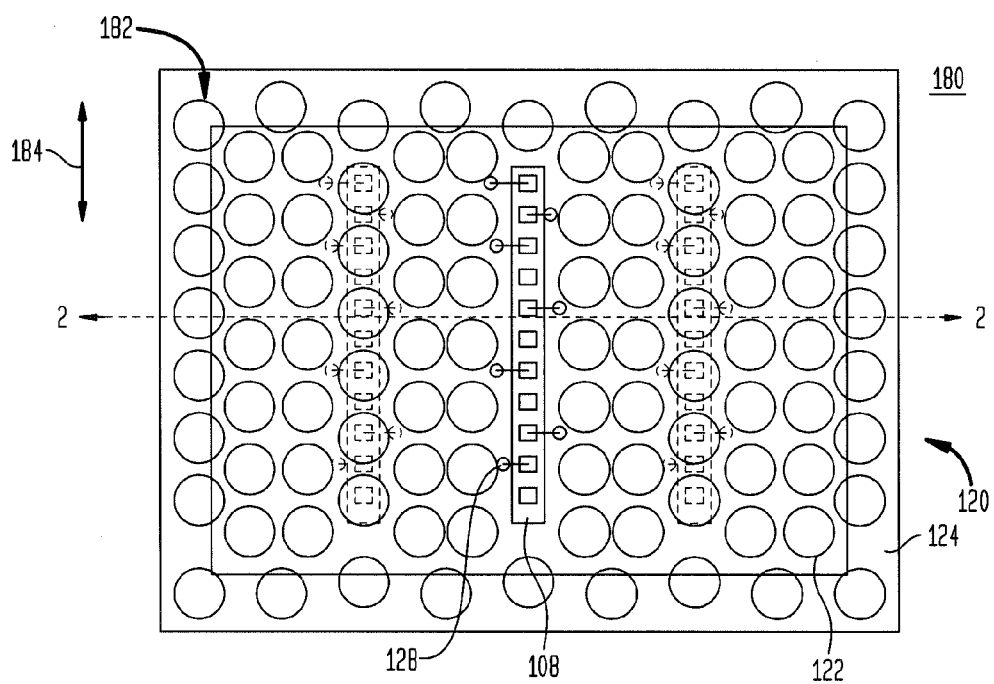
FIG. 2B is a bottom plan view of a microelectronic package or assembly in accordance with an embodiment of the invention depicted in FIG. 2, wherein the sectional view of FIG. 2 is through line 2-2 of FIG. 2B.

FIGS. 2A and 2B are a corresponding top plan view and a bottom plan view further illustrating the microelectronic package 180 of FIG. 2. As seen in FIG. 2A, the first microelectronic element 102 partially overlies the front surfaces of the second and third microelectronic elements 104, 170. Contacts of the second and third microelectronic elements are aligned with apertures 118, 176 in the first substrate 110, and leads, e.g., wire bonds 116, 174 can electrically connect the contacts of the second and third microelectronic elements with corresponding contacts on the upwardly-facing surface 111 of the first substrate 110. As further seen in FIG. 2B, terminals 122, which can have joining units attached thereto, can cover surface 124 of the second substrate 120, except where clearance is required for aperture 108, i.e., the bond window, and contacts 128. The relative dimensions of the terminals may be larger or smaller than depicted in FIG. 2B, and the terminals may be spaced farther from the aperture 108 than shown in FIG. 2B. When solder balls are the joining units and the terminals are disposed at a pitch of 0.8 millimeters, for example, the solder balls can be arranged in parallel columns 182 which are parallel to an axis along which a lengthwise direction 184 of the bond window 108 extends. In such case, the gap between the parallel columns that is provided including the bond window 108 is a space that could have been filled with three such parallel columns when the columns are placed so as to achieve the same minimum 0.8 millimeter pitch between solder balls in the adjacent columns.

In a variation of the embodiment seen in FIGS. 2, 2A and 2B, the microelectronic package can include four microelectronic elements having a spatial arrangement on the first substrate similar to that shown and described below with reference to FIG. 11A, or with reference to FIG. 11B.

Figure 3:
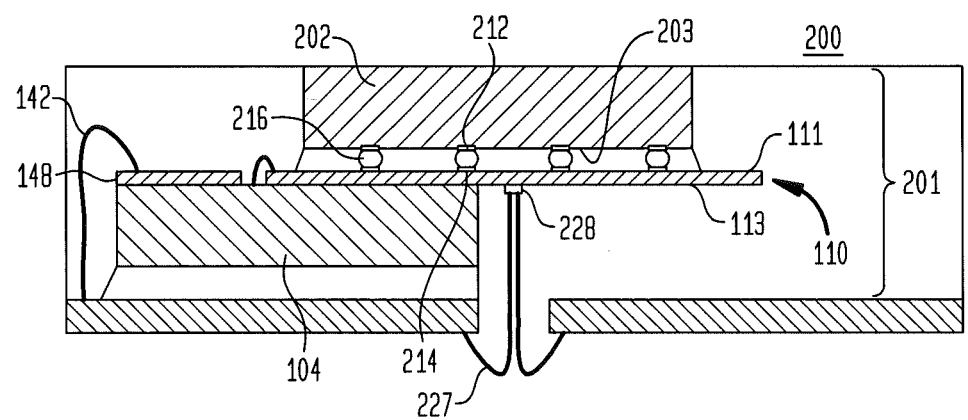
FIG. 3 is a sectional view of a microelectronic package or assembly in accordance with an embodiment of the invention.

FIG. 3 illustrates a microelectronic package according to a variation of the embodiment illustrated in FIG. 1. As shown therein, a first microelectronic element 202 can have a flip-chip electrical interconnection with the first substrate 110 in which contacts 212 at front surface 203 of the first microelectronic element face corresponding contacts 214 at the first surface 111 of the first substrate 110 and are joined thereto, such as through electrically conductive bumps 216, e.g., solder bumps, solid core solder bumps, stud bumps, metal posts, or other suitable electrically conductive joining units. Similar to the embodiment of FIG. 1, the second microelectronic element 104 overlies at least a portion of the front face 203 of the first microelectronic element 202. As seen in FIG. 3, in one embodiment, electrical interconnection between the subassembly 201 formed by first and second microelectronic elements 202, 104 and first substrate can be made through leads 227 extending to contacts 228 exposed at second surface 113 of the first substrate. Alternatively or in addition thereto, electrical interconnections 142 including leads, e.g., beam leads or wire bonds may extend about an edge of the first substrate, as described above relative to FIG. 1.

In one embodiment, the microelectronic element 202 may be a bare semiconductor chip or may be microelectronic element having a redistribution layer thereon, as described above. In a further example, the microelectronic element 202 can include two or more semiconductor chips combined together with an encapsulant contacting at least edges thereof and having an electrically conductive redistribution layer thereon, as described above relative to FIG. 1.

Figure 4:
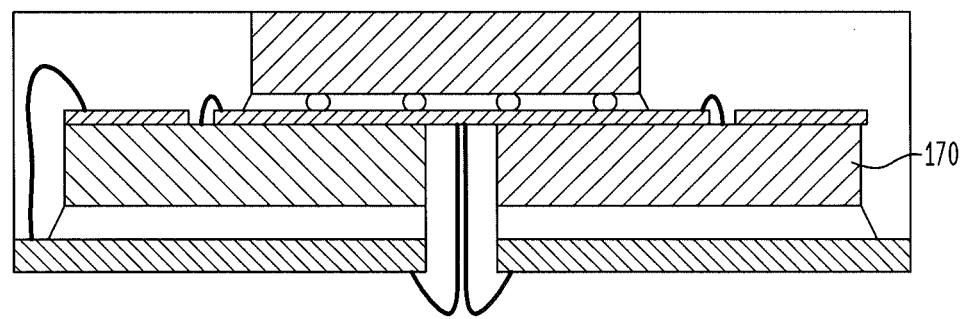
FIG. 4 is a sectional view of a microelectronic package or assembly in accordance with a variation of the embodiment depicted in FIG. 3.

FIG. 4 illustrates a variation of the package shown in FIG. 3, in which a third microelectronic element 170 is incorporated in the microelectronic package, in like manner to the third microelectronic element 170 shown and described above relative to FIG. 2.

Figure 5:
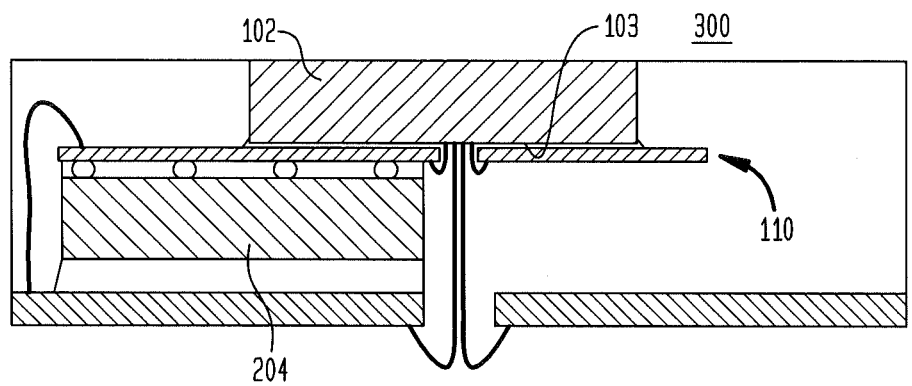
FIG. 5 is a sectional view of a microelectronic package or assembly in accordance with an embodiment of the invention.

FIG. 5 illustrates a variation of the embodiments shown and described above, in which the first microelectronic element 102 is assembled with the first substrate 110 in like manner to that of the first microelectronic element shown in FIG. 1. As also seen in FIG. 5, the second microelectronic element 204 is assembled with the first substrate 110 with a flip-chip electrical interconnection, i.e., in like manner to the flip-chip interconnection of first microelectronic element 202 in the microelectronic package 200 of FIG. 3. As in the embodiment of FIG. 1, the second microelectronic element 204 overlies at least a portion of the front face 103 of the first microelectronic element 102.

Figure 6:
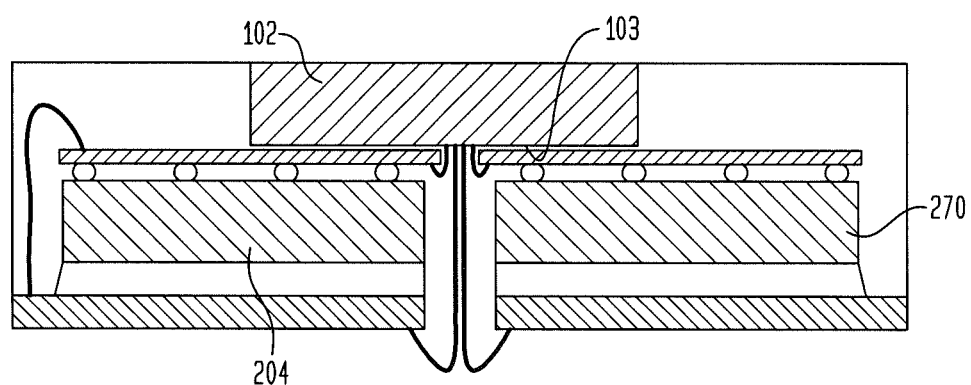
FIG. 6 is a sectional view of a microelectronic package or assembly in accordance with a variation of the embodiment depicted in FIG. 5.

FIG. 6 illustrates a variation of the embodiment shown and described above relative to FIG. 5, in which a third microelectronic element 270 is assembled with the first substrate 110 with a flip-chip electrical interconnection, i.e., in like manner to the flip-chip interconnection of second microelectronic element 204 in the microelectronic package 300 of FIG. 5. Similar to second microelectronic element 204, at least a portion of the third microelectronic element may overlie the front face 103 of the first microelectronic element 102.

Figure 7:
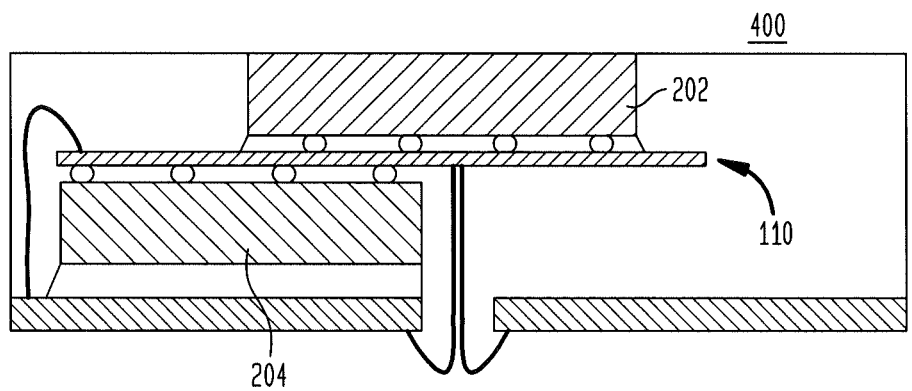
FIG. 7 is a sectional view of a microelectronic package or assembly in accordance with an embodiment of the invention.

FIG. 7 illustrates a microelectronic package 400 according to a further embodiment which is similar to FIG. 3, in which the first microelectronic element 202 has a flip-chip electrical interconnection with the first substrate 110. In addition, the second microelectronic element 204 also has a flip-chip electrical interconnection with the first substrate 110, similar to that of the second microelectronic element 204 shown in FIG. 5.

Figure 8:
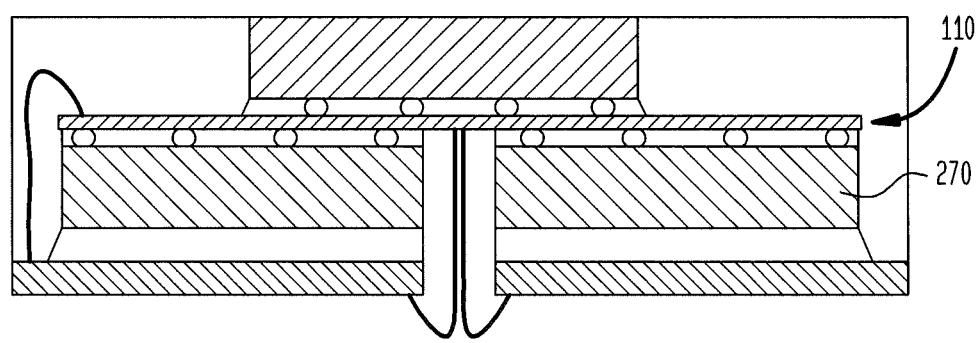
FIG. 8 is a sectional view of a microelectronic package or assembly in accordance with a variation of the embodiment depicted in FIG. 7.

FIG. 8 illustrates a variation of the embodiment shown in FIG. 7, in which a third microelectronic element 270 has a flip-chip electrical interconnection with the first substrate 110, similar to that of the third microelectronic element 270 shown in FIG. 6.

Figure 9:
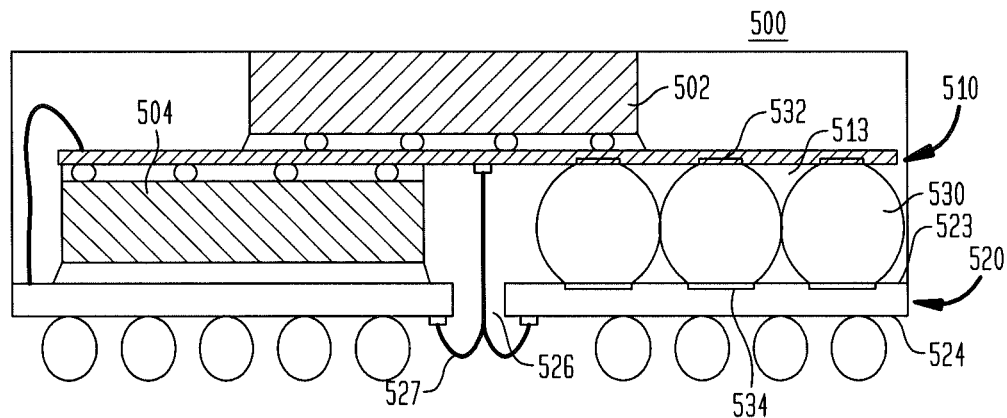
FIG. 9 is a sectional view of a microelectronic package or assembly in accordance with an embodiment of the invention.

FIG. 9 illustrates a microelectronic package 500 according to a variation of the embodiment shown in FIG. 7, in which the second substrate 520 need not have an aperture extending between first and second opposed surfaces thereof, i.e., such as aperture 126 of FIG. 1. Instead, subassembly 501 which includes first substrate 510 and microelectronic elements 502, 504 mounted and electrically interconnected therewith, can be electrically interconnected with the second substrate 520 through electrically conductive spacing elements 530. In this embodiment, the electrically conductive spacing elements 530 can include electrically conductive masses such as solder, tin, indium, conductive paste, conductive matrix material, which may or may not include solid cores of metal or other material. In one example, the electrically conductive spacing elements 530 can be solder balls or solder columns joined to first contacts, e.g., electrically conductive pads, exposed at a second surface 513 of the first substrate 510. As seen in FIG. 9, the spacing elements 530 can be joined to corresponding second contacts, e.g., electrically conductive pads, exposed at a first surface 523 of the second substrate 520. In one embodiment, the spacing elements can be distributed over an area of the second surface 513 of the first substrate. As further seen in FIG. 9, leads, e.g., wire bonds 527 connected to contacts of the first substrate 510, have portions aligned with aperture 526 in the second substrate 520. For example, wire bonds 527 can extend through the aperture 526 and be connected to contacts 528 on surface 524 of the second substrate 520.

Figure 10:
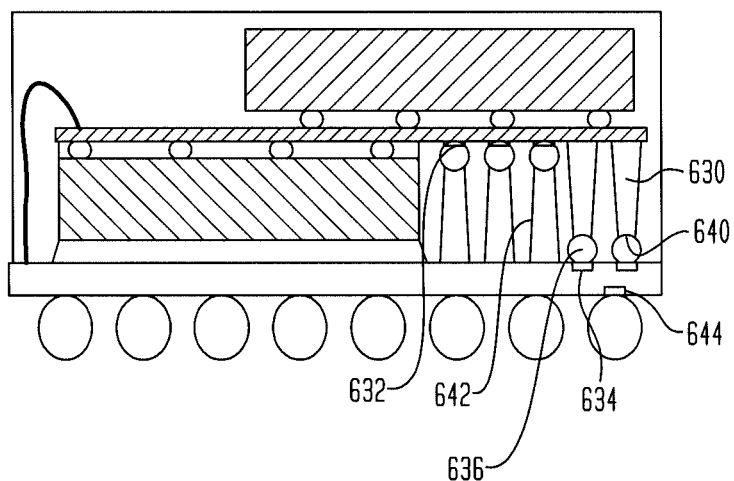
FIG. 10 is a sectional view of a microelectronic package or assembly in accordance with a variation of the embodiment depicted in FIG. 9.

FIG. 10 illustrates a variation of the microelectronic package 500 in which electrically conductive spacing elements 630 include solid metal posts projecting away from one or both of the first or second substrates towards the other of the first or second substrates. The solid metal posts may have end surfaces 640 and edge surfaces 642 extending away from the solid metal posts. In a particular embodiment, the metal posts 630 can be formed atop the second substrate by subtractive processing, such as by patterning, e.g., etching, milling, laser patterning, etc., a layer of metal, e.g., a metal sheet or foil, or a plated or otherwise deposited metal layer or. In a particular embodiment, such metal layer can be or include a layer of copper or copper alloy. In another embodiment, the metal posts 630 can be formed additively, such as through one or more depositions of metal, such as, without limitation, by plating, printing, stenciling, screen printing, dispensing, sputtering, chemical or other vapor deposition process.

The metal posts 630 can be joined to corresponding contacts 632, 634 of the first or second substrates 610, 620, respectively, through electrically conductive masses 636, e.g., masses of solder, tin, indium, conductive paste, conductive matrix material, etc. In this embodiment, like the embodiment described above with reference to FIG. 9, the second substrate may have an aperture, e.g., bond window therein similar to aperture 526 of FIG. 9, and the bond window can permit bonding of leads to contacts on the first substrate, the leads being electrically connected with terminals 644 on the second substrate. For example, the leads may be beam leads having portions aligned with the aperture, or may be wire bonds which also have portions aligned with the aperture, but which may extend through the aperture.

Figure 11:
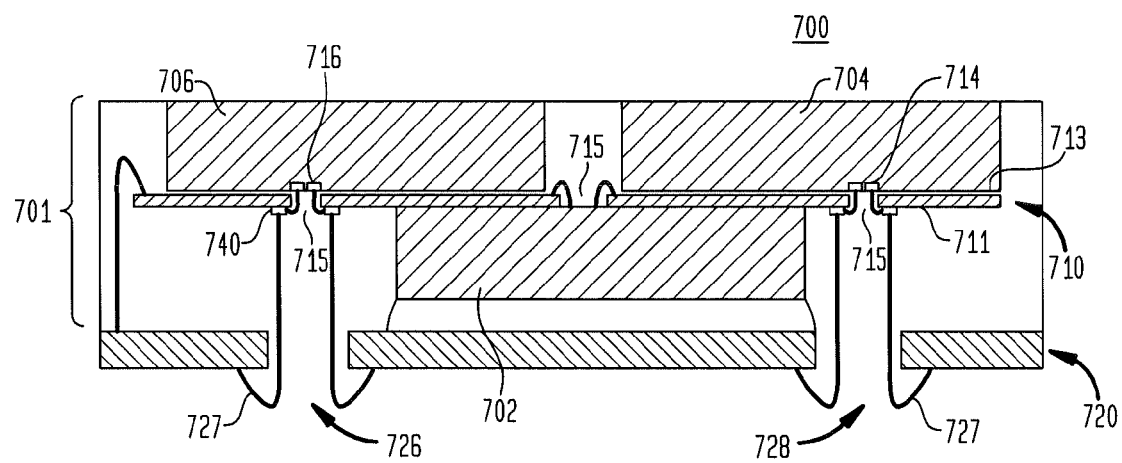
FIG. 11 is a sectional view of a microelectronic package or assembly in accordance with an embodiment of the invention.

FIG. 11 illustrates a microelectronic package according to a variation of the package 180 described above relative to FIG. 2 in which the subassembly 701 is inverted relative to the orientation of the subassembly 151 shown in FIG. 2, such that a first microelectronic element 702 is disposed between the first and second substrates 710, 720, and second and third microelectronic elements 704, 706 may partially or fully overlie the first microelectronic element. The second and third microelectronic elements 704, 706 overlie a surface 713 of the first substrate 710 opposite a surface 711 of the first substrate which faces the second substrate 720. Electrical interconnections between the subassembly 701 and the second substrate can be provided by leads 727 having portions aligned with first and second apertures 726, 728 extending through the second substrate 720. As seen in FIG. 11, the leads 727 may be connected directly to contacts 740 exposed at first surface 711 of the first substrate 710. Alternatively, some or all of the leads 727 can be connected directly to contacts 714, 718 exposed at front faces of the second and third microelectronic elements 704, 706.

Figure 11A:
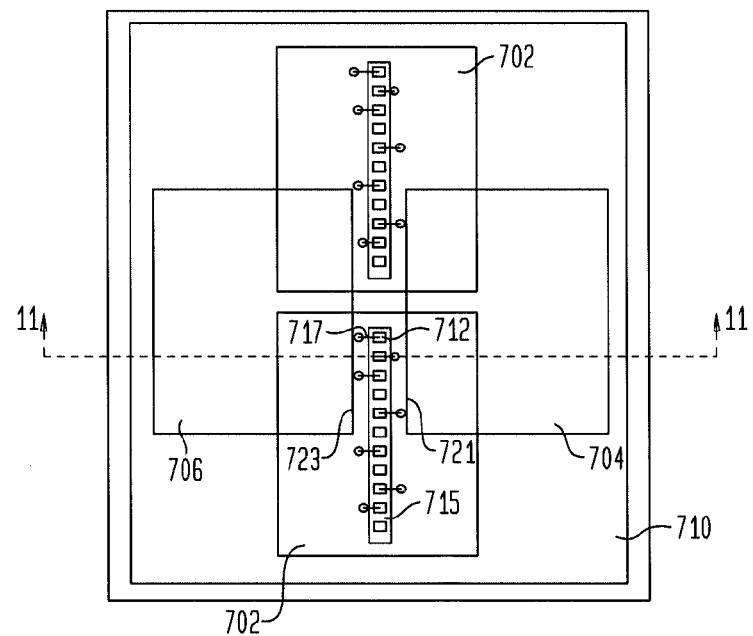
FIG. 11A is a plan view of a microelectronic package or assembly seen in FIG. 11, wherein the sectional view of FIG. 11 is taken through line 11-11 of FIG. 11A.

FIG. 11A is a top plan view illustrating a possible arrangement of four microelectronic elements corresponding to the arrangement illustrated in FIG. 11. As seen therein, microelectronic elements 704, 706 overlie microelectronic elements 702, and a bond window or aperture 715 in the first substrate 710 disposed at least partly between the adjacent edges 723, 725 of the second and third microelectronic elements 704, 706, respectively, allows leads or wire bonds to electrically connect contacts 712 of first microelectronic element 702 with substrate contacts 717. In this case, the apertures, e.g., bond windows, 715 are disposed at least partly between longer edges 723, 725 of adjacent microelectronic elements 704, 706 and have axes which are parallel to the longer edges.

Figure 11B:
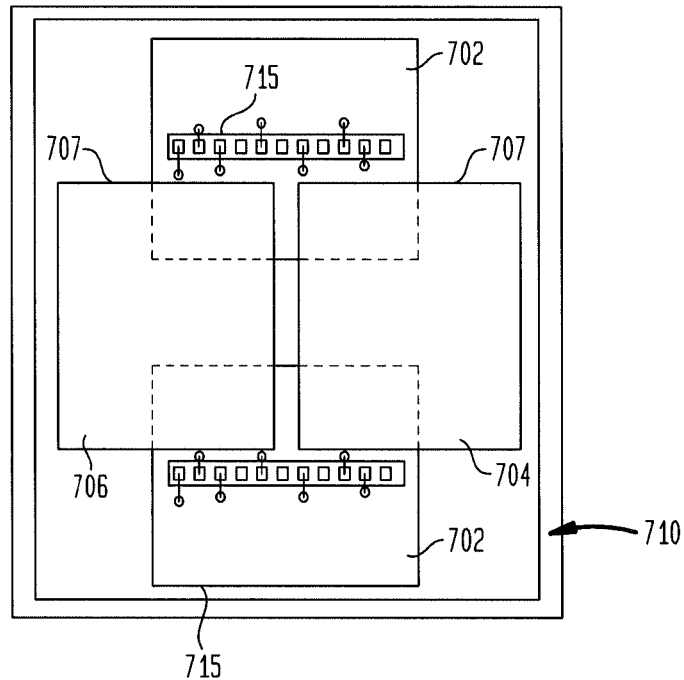
FIG. 11B is a plan view of a microelectronic package or assembly in accordance with a variation of the embodiment depicted in FIG. 11 or FIG. 2.

FIG. 11B is a top plan view illustrating another possible arrangement of four microelectronic elements in which microelectronic elements 704 and 706 face one of the first or second surfaces of the first substrate 710, and microelectronic elements 702 face the opposite surface of the first substrate. In this case, the apertures 715, e.g., bond windows are disposed beyond shorter edges 707 of microelectronic elements 704, 706 and extend along axes which are parallel to the shorter edges 707.

Figure 12:
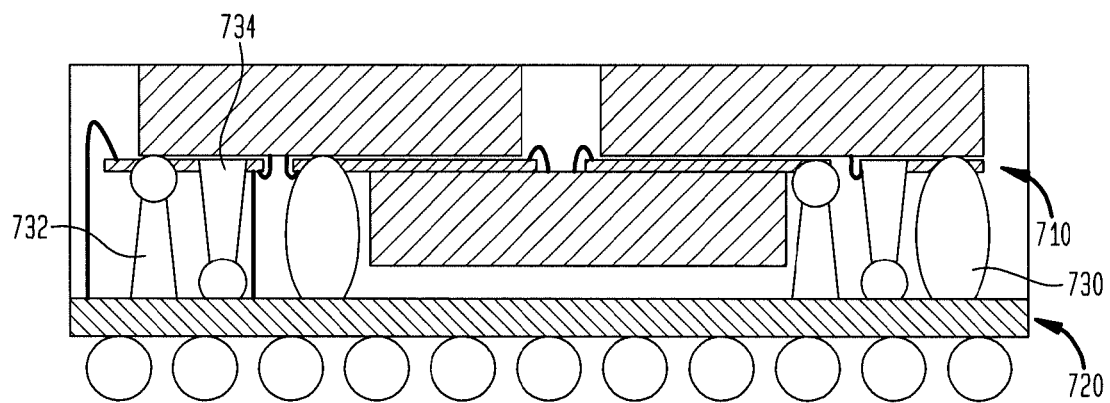
FIG. 12 is a sectional view of a microelectronic package or assembly in accordance with a variation of the embodiment depicted in FIG. 11.

FIG. 12 illustrates a variation of the embodiment shown in FIG. 11 in which the subassembly 701 is electrically interconnected with the second substrate through electrically conductive spacing elements. For example, the first and second substrates 710, 722 shown in FIG. 12 can be connected in like manner to the electrical interconnections provided between the first and second substrates as shown and described above relative to FIG. 9, or in like manner to the electrical interconnections between the first and second substrates as shown and described above relative to FIG. 10.

Figure 13:
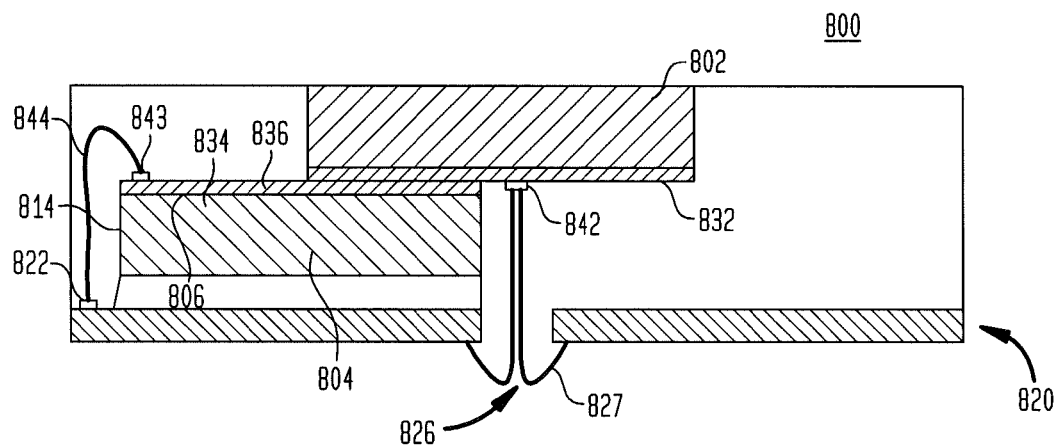
FIG. 13 is a sectional view of a microelectronic package or assembly in accordance with an embodiment of the invention.

FIG. 13 illustrates a microelectronic package 800 according to another variation of the above-described package 100 (FIG. 1) in which each of first and second microelectronic elements 802, 804 have electrically conductive redistribution layers 832, 836 thereon. In this embodiment, the first substrate can be omitted, because electrically conductive contacts, e.g., redistribution contacts of the redistribution layers of the first and second microelectronic elements can be joined to one another directly, such as through electrically conductive bumps, similar to bumps used in flip-chip electrical interconnections as described above. As further shown in FIG. 12, leads 827 having portions aligned with an aperture 826 in substrate can be electrically connected directly to redistribution layer contacts of the first microelectronic element 802 or even directly to some or all contacts of the semiconductor chip within microelectronic element 802. Another form of electrical interconnection that can be provided in addition to, or alternatively in place of leads 826 are electrical interconnections 844 which extend about an edge 814 of the second microelectronic element 804. For example, the electrical interconnections 844 can be wire bonds connected to redistribution layer contacts 843 or semiconductor chip contacts exposed at a front face 806 of the second microelectronic element. Such wire bonds can be connected to contacts 822 of substrate 820, for example.

Figure 14:
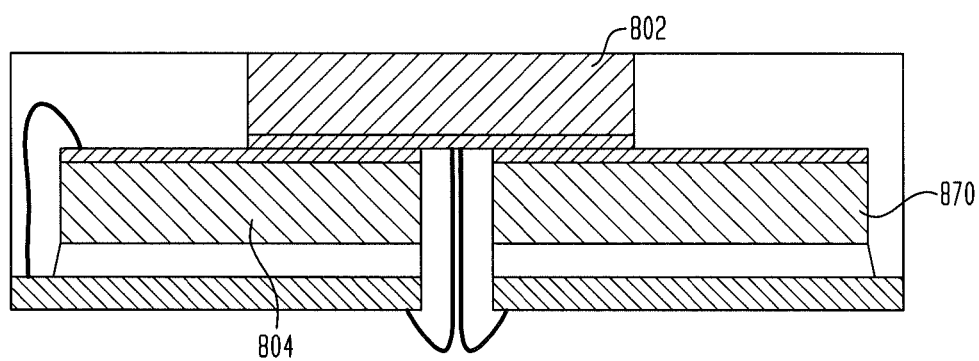
FIG. 14 is a sectional view of a microelectronic package or assembly in accordance with a variation of the embodiment depicted in FIG. 13.

FIG. 14 illustrates a variation of the embodiment seen in FIG. 13 which further includes a third microelectronic element 870 having an electrically conductive redistribution layer 836 thereon. The third microelectronic element can be electrically interconnected with the first microelectronic element in like manner to that between the first and second microelectronic elements 802, 804 as described above.

A microelectronic assembly or microelectronic package in accordance with any of the above-described embodiments can be incorporated within a system such as a computer, such as a desktop, laptop or tablet computing system, smartphone, cellular telephone, navigation system, music or media player, or any of many other types of electronic devices and systems.

Figure 15:
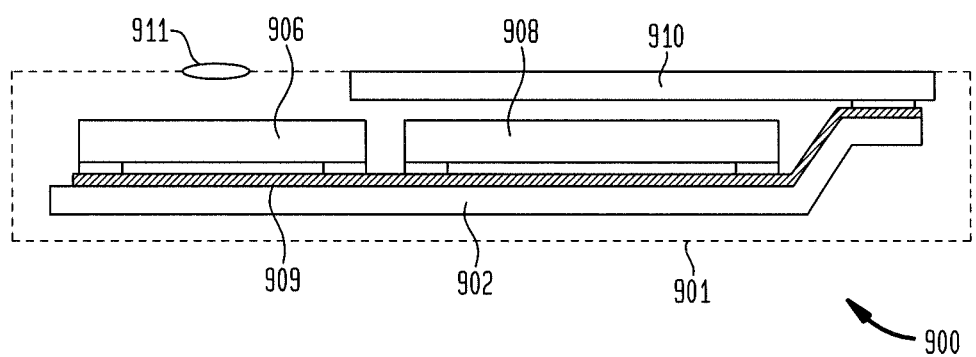
FIG. 15 is a sectional view schematically illustrating components of a system and housing with which a microelectronic package or assembly can be incorporated in accordance with an embodiment of the invention.

Merely by way of example and without limitation to the examples discussed above, the following combinations of chips may be included in microelectronic packages or higher-level assemblies which include a microelectronic package or microelectronic assembly having features as discussed above: (i) a processor and other devices used with the processor; (ii) plural memory chips of the same type; (iii) plural memory chips of diverse types, such as DRAM, SRAM, flash memory or other non-volatile memory, e.g., resistive RAM ("RRAM"), or memory other than random access memory; (iv) an image sensor and an image processor used to process the image from the sensor; (v) an application-specific integrated circuit ("ASIC") and one or more other microelectronic elements, which may or may not include chips having a memory storage array as their predominant function. The structures discussed above can be utilized in construction of diverse electronic systems. For example, a system 900 in accordance with a further embodiment of the invention includes a novel microelectronic assembly or package 906 as described above in conjunction with other electronic components 908 and 910. In the example depicted, component 908 is a semiconductor chip whereas component 910 is a display screen, but any other components can be used. Of course, although only two additional components are depicted in FIG. 9 for clarity of illustration, the system may include any number of such components. Microelectronic assembly or microelectronic package 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit panel or circuit board, and the circuit panel includes numerous conductors 909, of which only one is depicted in FIG. 15, interconnecting the components with one another. However, this is merely exemplary; any suitable structure for making electrical connections can be used. The housing 901 is depicted as a portable housing of the type usable, for example, in a cellular telephone, tablet computing system, electronic reader or personal digital assistant, and screen 910 is exposed at the surface of the housing. Where microelectronic assembly 906 includes a light-sensitive element such as an imaging chip or is packaged or mounted in housing 901 which also incorporates a light-sensitive element such as an imaging chip (not shown), a lens 911 or other optical device also may be provided for routing light to the imaging chip. Again, the simplified system shown in FIG. 15 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:
1. A microelectronic package, comprising:
(a) a subassembly including:
a first substrate having oppositely-facing first and second surfaces;
a first microelectronic element having a front surface facing the first surface of the first substrate, the first microelectronic element having a plurality of first contacts at the front surface thereof electrically connected with the first substrate; and a second microelectronic element having a front surface facing the second surface of the first substrate and overlying at least a portion of the front surface of the first microelectronic element, the second microelectronic element having a plurality of second contacts at the front surface thereof electrically connected with the first substrate; and (b) a second substrate having a first surface facing the subassembly and a second surface opposed thereto and an aperture extending between the first and second surfaces thereof, the second substrate having terminals configured for electrical interconnecting the microelectronic package with an external component; and (c) leads electrically connecting the subassembly with the second substrate, at least portions of the leads aligned with the aperture.

2. The microelectronic package as claimed in claim 1, wherein the leads are wire bonds extending through the aperture.

3. The microelectronic package as claimed in claim 2, wherein the first substrate includes an aperture extending between the first and second surfaces, wherein the wire bonds include wire bonds joined to contacts at the front surface of the first microelectronic element.

4. The microelectronic package as claimed in claim 1, further comprising wire bonds extending from substrate contacts on one of the first or second surfaces of the first substrate.

5. The microelectronic package as claimed in claim 1, wherein the leads include beam leads extending along a surface of the second substrate and beyond an edge of the second substrate.

6. The microelectronic package as claimed in claim 1, further comprising wire bonds extending about an edge of the first substrate and bonded to contacts at the first surface of the second substrate.

7. The microelectronic package as claimed in claim 1, further comprising:
first and second electrically conductive spacer elements each extending in a direction between one of the first or second surfaces of the first substrate and the first surface of the second substrate and electrically interconnecting the first and second substrates, the first and second spacer elements configured to simultaneously carry first and second different signals.

8. The microelectronic package as claimed in claim 7, wherein each electrically conductive spacer element is joined to a first contact of the first substrate and to a second contact of the second substrate.

9. The microelectronic package as claimed in claim 7, wherein each electrically conductive spacer element includes an electrically conductive mass.

10. The microelectronic package as claimed in claim 7, wherein each electrically conductive spacer element includes a solid metal post having an end surface projecting to a height above a surface of the first or second substrates, and an edge surface extending at an angle away from the end surface.

11. The microelectronic package as claimed in claim 1, further comprising an encapsulant contacting the first and second microelectronic elements.

12. The microelectronic package as claimed in claim 1, wherein the encapsulant is an overmold contacting at least edges of the first and second microelectronic elements.

13. The microelectronic package as claimed in claim 12, wherein the encapsulant fully covers the first and second microelectronic elements.

14. The microelectronic package of claim 7, wherein the first and second substrates include apertures extending therethrough between the first and second surfaces thereof, and the leads have portions aligned with the first and second apertures and joined to the element contacts at the front face of the first microelectronic element.

15. The microelectronic package of claim 11, further comprising second leads having portions aligned with the aperture in the second substrate, the second leads electrically connecting the first contacts of the first microelectronic element with the first substrate.

16. The microelectronic package of claim 15, wherein the second leads include wire bonds extending through the aperture.

17. The microelectronic package of claim 15, wherein the second leads are wire bonds.

18. The microelectronic package of claim 11, further comprising second leads have portions extending beyond an edge of the first substrate, the portions joined with the first contacts.

19. The microelectronic package of claim 16, wherein the edge is an edge of a second aperture extending between the first and second surfaces of the first substrate, the second leads having portions aligned with the second aperture, the portions being joined with the first contacts.

20. The microelectronic package of claim 11, further comprising third leads electrically connecting at least some of the second contacts of the second microelectronic element with the first substrate.

21. The microelectronic package of claim 20, wherein the third leads have portions extending beyond an edge of the first substrate, the portions joined with the second contacts.

22. The microelectronic package of claim 21, wherein the edge is an edge of a second aperture extending between the first and second surfaces of the first substrate, the third leads having portions aligned with the second aperture, the portions being joined with the second contacts.

23. The microelectronic package of claim 22, wherein the second contacts of the second microelectronic element are disposed beyond an edge of the first microelectronic element, and the third leads extend from the second contacts through the second aperture.

24. The microelectronic package of claim 23, wherein the third leads include wirebonds.

25. The package of claim 1, further comprising a third microelectronic element having a front surface facing the first substrate and overlying at least a portion of the front surface of the first microelectronic element, the third microelectronic element having a plurality of third contacts at the front surface thereof electrically connected with the first substrate.

26. The microelectronic assembly of claim 1, further comprising fourth leads electrically connecting at least some of the third contacts of the third microelectronic element with the first substrate.

27. The microelectronic package of claim 26, wherein the fourth leads have portions extending beyond an edge of the first substrate, the portions joined with the third contacts.

28. The microelectronic package of claim 27, wherein the edge is an edge of a second aperture extending between the first and second surfaces of the first substrate, the fourth leads having portions aligned with the second aperture, the portions being joined with the third contacts.

29. The microelectronic package of claim 28, wherein the third contacts of the third microelectronic element are disposed beyond an edge of the first microelectronic element, and the fourth leads extend from the third contacts through the second aperture.

30. The microelectronic package of claim 29, wherein the fourth leads include wirebonds.

31. The microelectronic package of claim 25, wherein the second and third microelectronic elements are disposed between the first and second substrates.

32. The microelectronic package of claim 25, wherein the first microelectronic element is disposed between the first and second substrates.

33. The microelectronic package of claim 1, wherein the first contacts of the first microelectronic element face first substrate contacts exposed at the first surface of the substrate, the microelectronic assembly further comprising conductive masses electrically connecting the first contacts with the first substrate contacts.

34. The microelectronic package of claim 1, wherein the second contacts of the second microelectronic element face second substrate contacts exposed at the second surface of the first substrate, the microelectronic assembly further comprising conductive masses electrically connecting the second contacts with the second substrate contacts.

35. A system comprising a microelectronic package, comprising:
(a) a subassembly including:
  a first substrate having oppositely-facing first and second surfaces;
  a first microelectronic element having a front surface facing the first surface of the first substrate, the first microelectronic element having a plurality of first contacts at the front surface thereof electrically connected with the first substrate; and
  a second microelectronic element having a front surface facing the second surface of the first substrate and overlying at least a portion of the front surface of the first microelectronic element, the second microelectronic element having a plurality of second contacts at the front surface thereof electrically connected with the first substrate; and
(b) a second substrate having a first surface facing the subassembly and a second surface opposed thereto and an aperture extending between the first and second surfaces thereof, the second substrate having terminals configured for electrical interconnecting the microelectronic package with an external component; and
(c) leads electrically connecting the subassembly with the second substrate, at least portions of the leads aligned with the aperture; and
(d) a third microelectronic element having a front surface facing the first substrate and overlying at least a portion of the front surface of the first microelectronic element, the third microelectronic element having a plurality of third contacts at the front surface thereof electrically connected with the first substrate; and
(e) one or more other electronic components electrically connected to the microelectronic assembly.

36. The system as claimed in claim 35, further comprising: a housing, said microelectronic package being mounted to said housing.

37. The microelectronic package as claimed in claim 1, further comprising first and second electrically conductive spacer elements each extending in a direction between one of the first or second surfaces of the first substrate and the first surface of the second substrate and electrically interconnecting the first and second substrates, the first and second spacer elements configured to simultaneously carry first and second different signals.

* * * * *